(12) United States Patent
Shu et al.

(10) Patent No.: US 12,348,036 B2
(45) Date of Patent: Jul. 1, 2025

(54) ADAPTIVE ARC SUPPRESSION METHOD FOR GROUND FAULTS IN A COMBINED ACTIVE AND PASSIVE DISTRIBUTION NETWORK

(71) Applicant: KUNMING UNIVERSITY OF SCIENCE AND TECHNOLOGY, Kunming (CN)

(72) Inventors: Hongchun Shu, Kunming (CN); Jun Dong, Kunming (CN); Yuan Gao, Kunming (CN); Yutao Tang, Kunming (CN); Yiming Han, Kunming (CN); Kaiqing Tian, Kunming (CN)

(73) Assignee: KUNMING UNIVERSITY OF SCIENCE AND TECHNOLOGY (CN)

( * ) Notice: Subject to any disclaimer, the term of this patent is extended or adjusted under 35 U.S.C. 154(b) by 0 days.

(21) Appl. No.: 18/945,526

(22) Filed: Nov. 13, 2024

(65) Prior Publication Data
US 2025/0158400 A1 May 15, 2025

(30) Foreign Application Priority Data
Nov. 15, 2023 (CN) .......................... 202311521276.X

(51) Int. Cl.
*H02H 9/00* (2006.01)
*G01R 31/52* (2020.01)
(Continued)

(52) U.S. Cl.
CPC ............ *H02J 3/0012* (2020.01); *G01R 31/52* (2020.01); *H02H 9/08* (2013.01)

(58) Field of Classification Search
None
See application file for complete search history.

(56) References Cited

U.S. PATENT DOCUMENTS

2021/0036656 A1* 2/2021 Li ...................... G05B 23/0259

FOREIGN PATENT DOCUMENTS

| CN | 105610147 A | 5/2016 |
|----|-------------|--------|
| CN | 106602540 A | 4/2017 |

(Continued)

OTHER PUBLICATIONS

Guo Moufa, You Jianzhang, Lin Xianhui, Yang Gengjie, Miao Xiren, Flexible Arc-Suppression Optimization Method for Distribution Network Adaptable to Variation of Line Parameters and Load, Automation of Electric Power Systems, vol. 41, No. 8, Apr. 25, 2017, DOI: 10.7500/AEPS20160621001.

Primary Examiner — Stephen W Jackson

(57) ABSTRACT

This application presents an adaptive arc suppression method for ground faults in distribution networks, merging active and passive relay protection strategies. The method proceeds as follows: based on collected ground parameters, the fault phase is identified; compensation current is calculated from the fault's electromotive force, ground leakage resistance, and ground capacitance; current is injected at the neutral point according to the compensation current; finally, the arc suppression scheme is executed based on the zero-sequence voltage of the network's busbars. This approach incorporates both voltage- and current-based methods, addressing the limitation of fixed operation scenarios in traditional arc suppression methods. By quickly adapting to various fault situations, this method ensures an efficient and prompt response tailored to specific scenario requirements.

7 Claims, 8 Drawing Sheets

(51) Int. Cl.
*H02H 9/08* (2006.01)
*H02J 3/00* (2006.01)

(56) References Cited

FOREIGN PATENT DOCUMENTS

| | | |
|---|---|---|
| CN | 109672164 A | 4/2019 |
| CN | 112271714 A | 1/2021 |
| CN | 113097989 A | 9/2021 |
| CN | 115622015 A | 1/2023 |
| JP | 2011015504 A | 1/2011 |

\* cited by examiner ated into voltage-based and current-based suppression methods. The voltage-based suppression method clamps the fault phase voltage to zero, making it more suitable for high-resistance ground faults, but its effectiveness for metallic ground faults is not ideal. On the other hand, the current-based suppression method reduces the fault point current to zero, which is suitable for low-resistance faults but is ineffective for high-resistance faults.

In practical conditions, fault scenarios are generally complex, making it challenging for existing arc suppression methods in the related technologies to achieve adaptive suppression across various fault scenarios.

For example, Volume 41, Issue 8 of the journal Power System Automation published a flexible optimized arc suppression method for distribution networks that adapts to changes in line parameters and load. This method combines the advantages of both voltage and current suppression, addressing the shortcomings of single suppression methods. However, it does not consider the impact of unbalanced zero-sequence voltage, and the fault point current is not suppressed to zero, resulting in significant residual current that prevents successful arc suppression.

Invention Content

The embodiment of this application provides an adaptive arc suppression method for ground faults in a combined active and passive distribution network. This method addresses the technical issue in related technologies where existing arc suppression methods are confined to fixed operational scenarios, making it challenging to respond quickly to multiple fault situations. It achieves the technical effect of rapidly responding to the corresponding arc suppression mode based on the specific requirements of the fault scenario.

The embodiment of this application offers an adaptive arc suppression method for ground faults in a combined active and passive distribution network, which includes the following steps:

Identify the target fault phase based on the ground parameters collected from the distribution network.

Determine the compensation current based on the target electromotive force of the power source for the target fault phase, the target ground leakage resistance, and the target ground capacitance.

Inject current into the neutral point of the distribution network based on the calculated compensation current.

Establish and execute the arc suppression scheme based on the zero-sequence voltage of the busbars in the distribution network, which includes both voltage suppression and current suppression methods.

Optionally, the step of determining the target fault phase based on the ground parameters collected from the distribution network includes:
Acquiring the ground parameters for each feeder in the distribution network;
Determining the rated phase voltage magnitude and zero-sequence voltage based on the ground parameters;
Identifying the target fault phase based on the zero-sequence voltage and the rated phase voltage magnitude.

Optionally, the step of determining the target fault phase based on the zero-sequence voltage and the rated phase voltage magnitude includes:
When the zero-sequence voltage is greater than or equal to fifteen percent of the rated phase voltage magnitude, the target fault phase is determined based on the transient characteristics derived from the ground parameters;
Otherwise, the step of acquiring the ground parameters for each feeder in the distribution network is executed.

Optionally, the step of determining the compensation current based on the target electromotive force of the power source, the target ground leakage resistance, and the target ground capacitance corresponding to the target fault phase includes:
When the ground parameters of the three phases in the distribution network are symmetrical, determining the first product of the target electromotive force of the power source and the target ground leakage resistance;
Determining the second product of the target electromotive force of the power source and the target ground capacitance;
Determining the compensation current based on the first product and the second product.

Optionally, prior to the step of injecting current into the neutral point of the distribution network based on the compensation current, the following steps include:
When the ground parameters of the three phases in the distribution network are asymmetrical, determining the three-phase source electromotive force, neutral point voltage, three-phase ground leakage resistance, three-phase ground capacitance, and the grounding fault transition resistance of the target fault phase based on the ground parameters;
Determining the compensation current based on the three-phase source electromotive force, the neutral point voltage, the three-phase ground leakage resistance, the three-phase ground capacitance, and the grounding fault transition resistance.

Optionally, prior to the step of determining and executing the arc-suppression scheme based on the zero-sequence voltage of the busbar in the distribution network, the following steps include:
Determining the residual at the fault point and the additional excitation voltage of the target fault phase based on the ground parameters;

Determining the boundary setting value based on the residual at the fault point, the additional excitation voltage, and the target source electromotive force.

Optionally, the step of determining and executing the arc-suppression scheme based on the zero-sequence voltage of the busbar in the distribution network includes:

When the zero-sequence voltage is greater than or equal to the boundary setting value, determining the second neutral point voltage after initial compensation based on the target source electromotive force and the three-phase ground leakage resistance and three-phase ground capacitance of the distribution network;

Determining the first neutral point voltage prior to initial compensation based on historical ground parameters;

Determining the correction current based on the first neutral point voltage, the second neutral point voltage, and the compensation current;

Executing current arc-suppression at the neutral point based on the correction current.

Optionally, the step of determining and executing the arc-suppression scheme based on the zero-sequence voltage of the busbar in the distribution network includes:

When the zero-sequence voltage is not greater than the boundary setting value, determining the injected current based on the target source electromotive force and the three-phase ground leakage resistance and three-phase ground capacitance of the distribution network;

Executing voltage arc-suppression at the neutral point based on the injected current.

The method disclosed in this invention addresses the issue of electrical parameter imbalance that commonly exists in distribution networks. It accurately calculates the command current, enabling adaptive suppression of ground fault arcs. The method is closely aligned with the actual operating conditions of distribution networks, demonstrating strong universality.

Additionally, this application introduces an adaptive arc suppression device for ground faults in distribution networks, combining both active and passive components. This device comprises a memory, a processor, and an active-passive integrated adaptive arc suppression program stored in the memory, which can be executed on the processor. When the processor runs this program, it implements the steps of the adaptive arc suppression method for ground faults as previously described.

Furthermore, this application also proposes a computer-readable storage medium that contains the active-passive integrated adaptive arc suppression program for ground faults in distribution networks. When executed by a processor, this program performs the steps of the aforementioned adaptive arc suppression method.

The technical solutions provided in one or more embodiments of this application offer at least the following technical effects or advantages:

By utilizing ground parameters collected from the distribution network, the target fault phase is determined. Based on the target phase's electromotive force, target ground leakage resistance, and target ground capacitance, the compensation current is identified. Current injection is then applied to the neutral point of the distribution network based on this compensation current. The zero-sequence voltage of the bus in the distribution network is used to determine and execute the arc suppression scheme, which includes voltage and current suppression. This effectively resolves the technical problem found in related technologies where suppression methods operate under fixed conditions and struggle to respond quickly to multiple fault scenarios, achieving rapid response to the corresponding suppression modes based on situational requirements.

SPECIFIC IMPLEMENTATION

Figure 1:
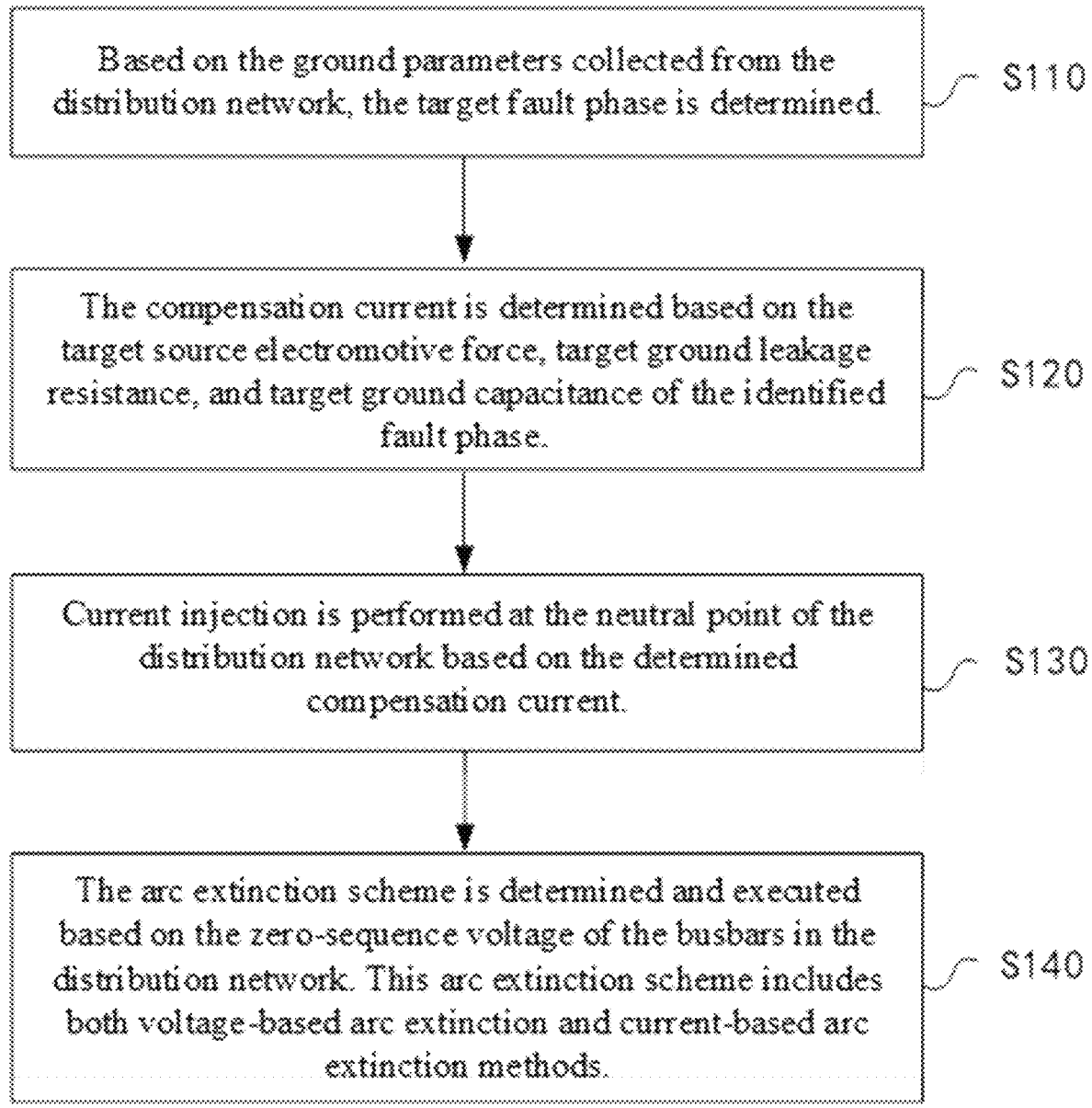
FIG. 1: Flowchart of the adaptive arc suppression method for grounding faults in the combined active and passive distribution network, Implementation Example 1.

In the relevant technology, the proportion of cable lines increases significantly. During a single-phase ground fault, the notable rise in system-to-ground capacitance generates a large ground current, making it difficult for the arc to extinguish on its own. Prolonged operation can easily damage equipment and lines, and in severe cases, it may lead to progressive faults or even wildfires. Current research indicates that single-phase ground faults in distribution networks can lead to arc faults, which are challenging to extinguish during transient conditions. Extended operation may result in damage to equipment and insulation, potentially causing fires or evolving into permanent faults.

At present, methods for suppression ground faults in distribution networks can be classified into voltage-type suppression and current-type suppression based on the control object. Voltage-type suppression clamps the fault phase voltage to zero, while current-type suppression reduces the fault point current to zero. Each suppression method has its advantages and disadvantages: voltage-type suppression is more suitable for high-resistance grounding faults but is less effective for metallic grounding faults; current-type suppression is applicable for low-resistance faults but less effective for high-resistance faults, and it is often used in conjunction with active converters, which can be costly.

To address different fault conditions, a combination of voltage suppression and current suppression can be employed to leverage the advantages of both methods, ensuring safe and reliable operation of the distribution network. The main technical solution adopted in this application involves: measuring the ground parameters of each feeder during normal operation of the distribution network; real-time acquisition of the three-phase bus voltage and zero-sequence voltage signals in the distribution network; determining whether a ground fault has occurred; continuously monitoring the neutral point current and adjusting compensation through the debugging suppression device; when a single-phase ground fault is detected, the current-type suppression is activated first, and the zero-sequence voltage of the bus is monitored. If the zero-sequence voltage is less than the set value, fault phase identification is performed, and voltage suppression is applied to the fault phase until its voltage reaches zero. If the zero-sequence voltage is not less than the set value, the neutral point continues to apply current suppression, thereby achieving strong sensitivity, rapid action, and high reliability in suppression performance.

The embodiment of this application addresses the issue of inadequate arc suppression effectiveness caused by the influence of line parameters and load on a single suppression method.

In this embodiment, the bus zero-sequence voltage is used as the condition for switching the arc suppression mechanism, which is easy to implement and allows for reliable control. This embodiment also takes into account the effects of unbalanced voltage, effectively improving the arc suppression performance, with a simple reference current calculation method.

The embodiment provides a low-cost, highly reliable arc suppression method that does not rely on high sampling rate equipment or complex electrical information. The required data volume is minimal, and the system configuration is flexible, enabling reliable suppression of unstable arcs even at low sampling rates. This approach demonstrates strong engineering practicality and can effectively enhance the operational reliability of medium-voltage distribution networks.

To better understand the aforementioned technical solutions, the following sections will describe exemplary embodiments of this application in greater detail with reference to the accompanying drawings. Although the drawings depict exemplary embodiments of this application, it should be understood that the application can be implemented in various forms and is not limited to the embodiments described herein. Instead, these examples are provided for a more thorough understanding of the application and to fully convey its scope to those skilled in the art.

Embodiment 1

This application discloses an adaptive arc suppression method for grounding faults in distribution networks, which combines both active and passive approaches. Referring to FIG. 1, the adaptive arc suppression method for grounding faults in distribution networks comprises the following steps:

Step S110: Determine the target fault phase based on the ground parameters collected from the distribution network.

In this embodiment, the distribution network is selected as a three-phase four-wire AC system, specifically consisting of four feeders. The ground parameters are the data collected through sensors installed in the AC system, which include, but are not limited to, the three-phase voltages, the neutral point-to-ground voltage, the total capacitance to ground for the three phases $C_A$, $C_B$, $C_C$, and the ground conductance for the three phases $g_A$, $g_B$, $g_C$. The target fault phase refers to the specific phase in the three-phase system corresponding to the feeder where the grounding fault has occurred.

As an optional embodiment, real-time data is collected for the grounding parameters of each feeder in the distribution network, specifically for phases A, B, C, and the neutral line. After collection, the grounding parameters are stored along with the time of acquisition. Based on the real-time collected grounding parameters, samples of the three-phase voltages in the distribution network and the neutral-to-ground voltage are taken. The total capacitances to ground for the three phases are calculated as $C_A$, $C_B$, and $C_C$, while the corresponding ground conductances are $g_A$, $g_B$, and $g_C$. These grounding parameters are continuously monitored and stored.

Voltage transformers on the bus are used to collect the three-phase bus voltages and the neutral-to-ground voltage, allowing for real-time monitoring and storage. The collected grounding parameters are then used to determine the rated phase voltage magnitude and the zero-sequence voltage. By analyzing the ratio of the zero-sequence voltage to the rated phase voltage magnitude, it is possible to ascertain whether a ground fault has occurred in any of the phases. The corresponding feeder, or target fault phase, is identified based on the applicable rated phase voltage magnitude.

In this embodiment, the rated phase voltage magnitude refers to the nominal voltage level of the alternating current in the power system, typically expressed in RMS (Root Mean Square) values. In a three-phase AC system, the rated phase voltage magnitude indicates the nominal voltage for each phase, commonly denoted as U. For example, in a three-phase AC system with a rated phase voltage of 220V, each phase will have a voltage magnitude of 220V. The rated phase voltage magnitude is a crucial parameter in the design and operation of power systems, used to define the voltage ratings of electrical equipment and the operating ranges of protective devices.

The zero-sequence voltage refers to the common-mode voltage among the three-phase voltages in a three-phase AC system, also known as zero-sequence voltage or neutral voltage. Under normal conditions, the three-phase voltages should be balanced, meaning that both the magnitudes and phases of the three voltages are equal. However, imbalances due to uneven loads, ground faults, or other factors can lead to conditions where the three-phase voltages are not equal in either magnitude or phase.

In exemplary scenarios, when there is an imbalance in three-phase voltage, a zero-sequence voltage is generated. Zero-sequence voltage refers to the common-mode voltage among the three-phase voltages, defined as the sum of the instantaneous values of the three-phase voltages divided by three. Its magnitude depends on the degree of imbalance in the three-phase voltages. To determine the zero-sequence voltage and the collection time of the zero-sequence voltage, the rated phase voltage magnitude of 220 volts is obtained. The value calculated as the sum of the instantaneous three-phase voltages divided by three is compared to 220 volts to ascertain whether a ground fault has occurred.

Step S120 involves determining the compensation current based on the target source electromotive force (EMF), the target ground leakage resistance, and the target ground capacitance of the faulted phase.

As an alternative implementation, assuming the faulted phase is A, the target source EMF, target ground leakage resistance, and target ground capacitance of the faulted phase are determined based on ground parameters. To achieve arc suppression, we have $\dot{U}_N = -\dot{E}_A$ which results in the fault point current $\dot{I}_f = 0$. Consequently, the compensation current is calculated based on the target source EMF, target ground leakage resistance, and target ground capacitance, where EA represents the target source EMF of the faulted phase, and UN is the neutral point voltage. Here, $\dot{U}_N = -\dot{E}_A$ represents both the average of the neutral point voltage and the average of the target source EMF.

Step S130: Inject current into the neutral point of the distribution network based on the compensation current.

In this embodiment, the current-type arc suppression method is primarily utilized in direct current circuits or low-voltage alternating current circuits. It eliminates arcs by converting the energy of the arc into current. In the current-type arc suppression method, when an arc occurs, an additional current source is introduced into the arc region. This current source is typically a larger inductor or capacitor, connected in series or parallel with the arc, forming an arc circuit. When the current in the arc circuit begins to flow, it counteracts the arc, thereby converting the arc energy into electrical energy. The principle of current-type arc suppression is to suppress the maintenance of the arc through the action of the current, allowing the arc to extinguish rapidly. When the current in the arc circuit reaches a certain level, the arc current value will exceed the maintenance current of the arc, leading to its extinguishment. In this embodiment, the compensation current refers to the additional current source.

After determining the compensation current, current is injected into the neutral point of the distribution network based on the determined compensation current to eliminate the arc.

Step S140: Determine and execute an arc suppression scheme based on the zero-sequence voltage of the busbars in the distribution network, where the arc suppression scheme includes both voltage suppression and current suppression.

In this embodiment, since a single voltage suppression or current suppression scheme may not be suitable for complex scenarios, after the initial compensation of the distribution network using the compensation current, the boundary setting values are determined based on the compensated grounding parameters. Furthermore, based on the numerical relationship between the zero-sequence voltage of the busbars and the boundary setting values, a decision is made on whether the further arc suppression scheme will be voltage suppression or current suppression.

As an optional implementation, boundary setting values and the zero-sequence voltage of the bus are obtained. Based on the numerical relationship between the boundary setting values and the zero-sequence voltage, it is determined whether the bus zero-sequence voltage is within the current suppression dead zone. The current suppression dead zone refers to a condition in power systems where the current may not be interrupted properly when it passes through zero due to the characteristics of electrical equipment, leading to a delay in current suppression. In this scenario, the current continues to flow near zero, creating a dead zone. If the bus zero-sequence voltage is detected to fall within the current suppression dead zone, fault phase identification is performed, and voltage suppression is applied to the fault phase until the fault phase voltage drops to zero. Conversely, if the bus zero-sequence voltage is not in the current suppression dead zone, the corrective current is determined, and current suppression continues based on the corrective current.

By utilizing ground parameters collected from the distribution network, the target fault phase is identified. The compensating current is determined based on the target fault phase's source electromotive force, target ground leakage resistance, and target ground capacitance. Current injection is then directed to the neutral point of the distribution network based on the compensating current. Furthermore, a fault suppression scheme is determined and executed based on the zero-sequence voltage of the bus in the distribution network, which includes both voltage suppression and current suppression. This effectively addresses the technical issue in related technologies where existing suppression methods have fixed operating scenarios, making it difficult to respond quickly to multiple fault scenarios. The implementation achieves a rapid response to corresponding suppression modes based on the demands of the specific scenario Based on Embodiment One, this application proposes an adaptive arc suppression method for grounding faults in a distribution network that combines both active and passive elements in Embodiment 2. The steps involved include:

Step S210: Obtain the grounding parameters for each feeder in the distribution network.

In this embodiment, the grounding parameters for each feeder are measured, and the three-phase voltage and neutral point to ground voltage of the distribution network are sampled. The total grounding capacitance for the three phases is measured as $C_A$, $C_B$, and $C_C$, while the grounding conductance is measured as $g_A$, $g_B$, and $g_C$. These parameters are monitored in real-time and stored. Additionally, voltage transformers on the bus are used to collect the three-phase bus voltage and the neutral point to ground voltage, which are also monitored and saved in real-time. When collecting the grounding parameters, the parameters are stored with their corresponding timestamps to establish a correlation between each grounding parameter and the time of collection.

Step S220: Determine the rated phase voltage magnitude and zero-sequence voltage of the feeder based on the ground parameters. In this embodiment, the rated phase voltage magnitude corresponding to each feeder at each collection time is determined based on the ground parameters, and the zero-sequence voltage is determined by the sum of the voltage values of each feeder.

Step S230: Determine the target fault phase based on the zero-sequence voltage and the rated phase voltage magnitude. In this embodiment, when the ratio of the zero-sequence voltage to the rated phase voltage magnitude meets a preset condition, it is determined that a single-phase ground fault has occurred in the distribution network. The identification of the fault phase is based on the transient characteristics of the three-phase voltage.

As an optional implementation, the fault phase can be determined by comparing the peak values of the three-phase voltage signals. When a fault occurs in one phase, the voltage peak of that phase will show a significant drop compared to the other two phases, allowing for the identification of the fault phase.

As another optional implementation, the fault phase can be determined by calculating the positive, negative, and zero-sequence components of the three-phase voltage signals. When a fault occurs, the positive-sequence component will change, and the fault phase can be identified by comparing the magnitudes of the positive-sequence components.

As yet another optional implementation, the fault phase can be determined by calculating the instantaneous power of the three-phase voltage signals. When a fault occurs, the instantaneous power of the fault phase will show a significant change, allowing for the identification of the fault phase by comparing the magnitudes of the instantaneous power.

Optionally, Step S230 includes:

Step S231: When the zero-mode voltage is greater than or equal to fifteen percent of the rated phase voltage magnitude, determine the target fault phase based on the transient characteristics identified from the ground parameters;

Step S231: Otherwise, execute the step of obtaining the ground parameters for each feeder in the distribution network.

As an optional embodiment, after determining the zero-mode voltage and the rated phase voltage magnitude, if $u_0 \geq 15\% \, U_m$, then a grounding fault occurs; if $u_0 \leq 15\% \, U_m$, then no grounding fault occurs. Proceed to execute the step of collecting ground parameters, where $U_m$ is the rated phase voltage magnitude, and $u_0$ is the zero-mode voltage.

In this embodiment, when a fault occurs, the fault current and voltage exhibit transient changes. These transient variations can be detected and identified by analyzing the three-phase voltage signals, thereby enabling the rapid determination of the target fault phase and the execution of current injection for arc suppression.

Figure 2:
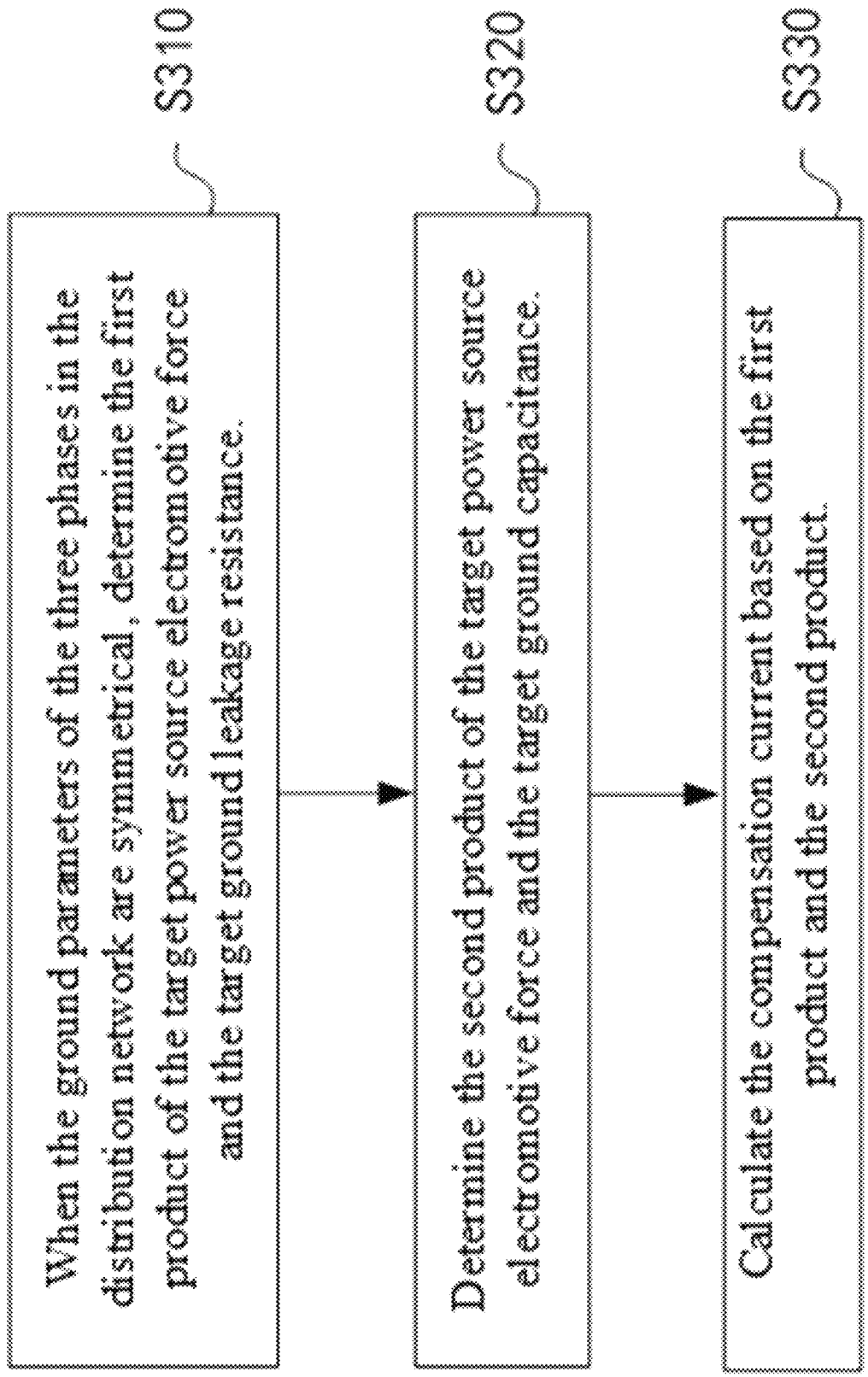
FIG. 2: Flowchart of Steps S310-S330 in the adaptive arc suppression method for grounding faults in the combined active and passive distribution network, Implementation Example 3.

Based on Embodiment 1, this application proposes a method for adaptive arc suppression in distribution networks that combines active and passive elements in Embodiment 3, as referenced in FIG. 2. The steps are as follows: Step S120 includes:

Step S310: When the ground parameters of the three phases in the distribution network are symmetrical, determine the first product of the target power supply electromotive force (EMF) and the target ground leakage resistance.

Step S320: Determine the second product of the target power supply EMF and the target ground capacitance.

Step S330: Determine the compensation current based on the first product and the second product.

As an optional embodiment, the first product of the target power supply EMF and the target ground leakage resistance is determined by calculating the product based on the parameters and topology of the distribution network. This product represents the capacity of the current source required for arc suppression. The second product of the target power supply EMF and the target ground capacitance is also determined by calculating the product based on the distribution network's parameters and topology. This product represents the response time of the current source needed for arc suppression.

The compensation current is determined by comparing and analyzing the first product and the second product to establish an appropriate compensation current magnitude. The role of the compensation current is to be connected in series or parallel with the arc, thereby counteracting the arc and converting the arc energy into electrical energy. Based on the compensation current, the distribution network performs current-type arc suppression: the determined compensation current is introduced into the arc region to counteract the arc, allowing it to extinguish rapidly.

Optionally, prior to step S130, the method further includes:

Step S340: When the ground parameters of the three-phase distribution network are asymmetric, determine the three-phase source electromotive force, neutral point voltage, three-phase ground leakage resistance, three-phase ground capacitance, and the grounding fault transfer resistance of the target fault phase based on the ground parameters.

Step S350: Calculate the compensation current based on the three-phase source electromotive force, the neutral point voltage, the three-phase ground leakage resistance, the three-phase ground capacitance, and the grounding fault transfer resistance.

As an alternative embodiment, the three-phase source electromotive force is computed according to the parameters and topology of the distribution network. Due to the asymmetry of the ground parameters, the three-phase source electromotive forces may not be identical. The neutral point voltage is determined and calculated based on the parameters and topology of the distribution network. The neutral point voltage is the average value of the three-phase source electromotive forces.

The three-phase ground leakage resistance and three-phase ground capacitance are determined and computed according to the parameters and topology of the distribution network. These parameters reflect the ground performance within the distribution network. The grounding fault transfer resistance of the target fault phase is established based on actual fault conditions and measurement data, representing the resistance between the fault phase and the ground.

The compensation current is determined using Kirchhoff's First Law through the injected current equations. The compensation current is calculated based on the three-phase source electromotive force, neutral point voltage, three-phase ground leakage resistance, three-phase ground capacitance, and the grounding fault transfer resistance of the target fault phase. The injected current equations, based on the principle of conservation of current, are utilized to calculate the compensation current.

Exemplary Description: Based on the parameters and topology of the distribution network, calculate the electromotive forces (EMF) of each phase. Assume the three-phase EMFs are denoted as Ea, Eb, and Ec. Calculate the average of the three-phase EMFs, which yields the neutral point voltage Un=(Ea+Eb+Ec)/3.

Using the parameters and topology of the distribution network, determine the ground leakage resistance and ground capacitance for each phase. Let the three-phase ground leakage resistances be Ra, Rb, and Rc, and the three-phase ground capacitances be Ca, Cb, and Cc. Based on the actual fault conditions and measurement data, ascertain the ground fault transition resistance Rf for the target faulted phase.

Utilizing the three-phase EMFs, neutral point voltage, three-phase ground leakage resistances, three-phase ground capacitances, and the ground fault transition resistance of the target faulted phase, calculate the compensating current using Kirchhoff's First Law and the injected current equation: Iin=(Ea−Un)/(Ra+(1/jωCa))+(Eb−Un)/(Rb+(1/jωCb))+(Ec−Un)/(Rc+(1/jωCc))−Un/(Rf+(1/jωCf)). Where j is the imaginary unit and ω is the angular frequency.

As an example of this embodiment, assume the faulted phase is phase A. The injected current equation applied to the neutral point of the distribution network using Kirchhoff's First Law is as follows:

$$\dot{I}_{in} = (\dot{U}_N + \dot{E}_A)\left(\frac{1}{R_A} + j\omega C_A + \frac{1}{R_f}\right) +$$
$$(\dot{U}_N + \dot{E}_B)\left(\frac{1}{R_B} + j\omega C_B\right) + (\dot{U}_N + \dot{E}_C)\left(\frac{1}{R_C} + j\omega C_C\right) +$$
$$\dot{U}_N \frac{1}{j\omega L} + \dot{U}_{oh}\left(j\omega(C_A + C_B + C_C) + \frac{1}{R_A} + \frac{1}{R_B} + \frac{1}{R_C} + \frac{1}{j\omega_n L}\right)$$

Where, $\dot{E}_A$, $\dot{E}_B$, $\dot{E}_C$ are the electromotive forces of the three-phase power supply in the distribution network, $\dot{U}_N$ refers to the neutral point voltage, L signifies the inductance of the arc suppression coil, while $R_A$, $R_B$, $R_C$ are the ground leakage resistances for the three phases in the distribution network. Additionally, $C_A$, $C_B$, $C_C$ are the ground capacitances for the three phases in the distribution network, and $R_f$ denotes the transitional resistance for grounding faults.

When the three-phase parameters are balanced, i.e., $\dot{E}_A+\dot{E}_B+\dot{E}_C=0$, and the lines in the distribution network have been completely transposed such that $C_A=C_B=C_C=C_0$ and $R_A=R_B=R_C=R_0$, the following can be obtained:

$$\dot{I}_{in} = 3\frac{\dot{U}_N}{R_0} + 3j\dot{U}_N\omega C_0 + \dot{U}_N\frac{1}{j\omega L} + \frac{\dot{U}_N+\dot{E}_A}{R_f} + \dot{U}_{0h}\left(3j\omega C_0 + \frac{3}{R_0} + \frac{1}{j\omega_n L}\right)$$

$$\dot{I}_f = \frac{\dot{U}_N+\dot{E}_A}{R_f} = \dot{I}_{in} - \dot{U}_N\left(\frac{3}{R_0} + 3j\omega C_0 + \frac{1}{j\omega L}\right) - \dot{U}_{0h}\left(3j\omega C_0 + \frac{3}{R_0} + \frac{1}{j\omega_n L}\right)$$

Therefore, to achieve arc suppression, it follows that $\dot{U}_N=-\dot{E}_A$, resulting in a fault point current of $\dot{I}_f=0$ $$\dot{I}_{in} = -\dot{E}_A\left(\frac{3}{R_0} + 3j\omega C_0 + \frac{1}{j\omega L}\right) + \sum_{n=3,4}^{\infty} \dot{U}_{0h}\left(3j\omega C_0 + \frac{3}{R_0} + \frac{1}{j\omega_n L}\right)\circ$$

Where, $\omega$ represents the angular frequency, $\omega_n$ denotes the angular frequency under the n-th harmonic, j is the imaginary unit, $\dot{U}_N$ refers to the neutral point voltage, $R_0$ is the relative ground leakage resistance, $C_0$ is the relative ground capacitance, L signifies the inductance of the arc suppression coil, $U_{oh}$ indicates the neutral point voltage of the harmonic. That is, when the three-phase parameters are balanced, the compensating current is determined based on the target source electromotive force, target ground leakage resistance, target ground capacitance, angular frequency, imaginary unit, and the arc suppression coil.

Figure 3:
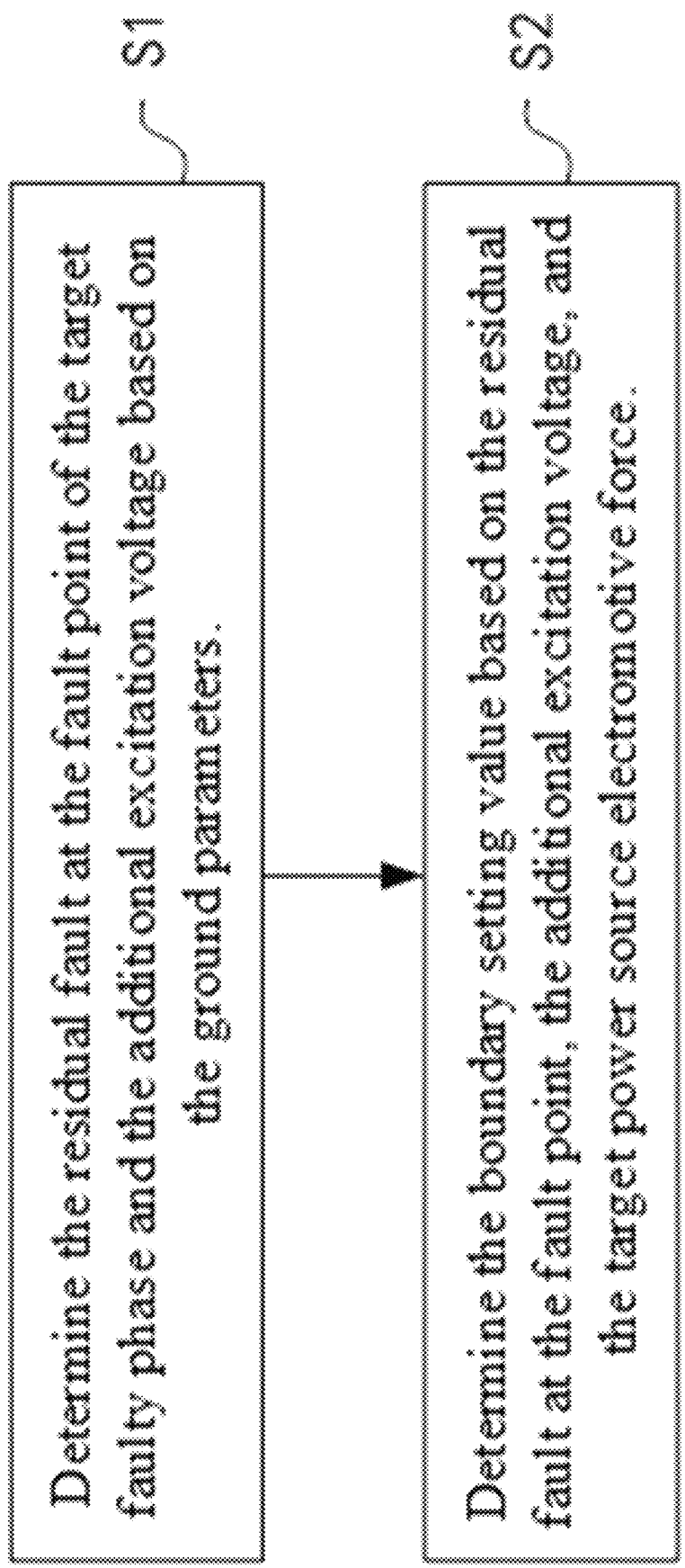
FIG. 3: Flowchart of Steps S1-S2 in the adaptive arc suppression method for grounding faults in the combined active and passive distribution network, Implementation Example 4.

Based on Embodiment 1, this application proposes a method for adaptive arc suppression in distribution networks that combines active and passive elements in Embodiment 4. Referring to FIG. 3, the process prior to Step S140 includes:

Step S1: Determine the fault point residual and additional excitation voltage for the target faulted phase based on the ground parameters.

Step S2: Establish the boundary setting value based on the fault point residual, additional excitation voltage, and target source electromotive force.

In this embodiment, the boundary setting value and the zero-sequence voltage of the bus are used to determine whether to execute current suppression or voltage suppression after initial compensation.

As an alternative implementation, based on the obtained ground parameters, determine the fault point residual and additional excitation voltage for the target faulted phase, establish the admittance parameters for each feeder, and ascertain the target source electromotive force for the target faulted phase. The boundary setting value is then determined based on the fault point residual, additional excitation voltage, admittance parameters for each feeder, and the target source electromotive force of the target faulted phase.

For example, check whether the zero-sequence voltage of the bus is less than the boundary setting value. The calculation formula for the setting value is as follows:

$$\dot{u}_{02} = \frac{-\dot{E}_A \dot{I}_\sigma}{(\dot{u}_f - \dot{E}_A)(Y_{0j} + Y_{0i}) + \dot{I}_\sigma}$$

Where $\dot{u}_{02}$ is the setting value for determining arc suppression, $\dot{u}_f$ is the additional excitation voltage at the fault point, $Y_{0j}$ is the total admittance of the faulted line, $Y_{0i}$ is the total admittance of the non-faulted lines, and $\dot{I}_\sigma$ is the fault point residual current.

To ensure reliable suppression of the grounding arc, an analysis of the causes of AC arc suppression indicates that minimizing the fault point residual current promotes self-suppression of the arc. The permissible limit for the fault point residual current is generally set between 5 to 10 A. Furthermore, according to regulations, during normal operation of the distribution network, the line voltage drop must be less than 5%, i.e., $|\dot{u}_f-\dot{E}_A|\leq 5\%\ \dot{E}_A$. By substituting the line admittance parameters $Y_{0j}+Y_{0i}$, the critical value of zero-sequence voltage $\dot{u}_{02}$ can be determined, serving as the condition for transitioning between current-type and voltage-type arc suppression.

Here's a professional English translation of your electric engineering patent description:

Optionally, Step S140 includes:

Step S410: When the zero-sequence voltage is greater than or equal to the boundary set value, determine the second neutral point voltage after initial compensation based on the target power supply electromotive force and the three-phase ground leakage resistance and capacitance of the distribution network.

In this embodiment, when the zero-sequence voltage is greater than or equal to the boundary set value, it is determined that the zero-sequence voltage falls within the current arc-suppression dead zone. This triggers the arc-suppression action. Initial compensation refers to the current compensation action in Step S130. The determination of whether to use voltage arc-suppression or current arc-suppression based on the ground parameters after initial compensation significantly enhances the flexibility and efficiency of the arc-suppression scheme.

In power systems, a bus refers to the main conductor for supplying and receiving electrical energy, typically a thick wire or busbar used to connect power equipment such as generators, transformers, switching devices, and loads. The zero-sequence voltage of the bus is defined as the zero-sequence component of the three-phase voltage, i.e., the magnitude of the vector sum of the three-phase voltages. Under normal conditions, the zero-sequence voltage of the bus should be zero, indicating no ground faults or imbalance conditions. Current arc suppression refers to the measures taken in power systems to rapidly reduce fault current to a safe level during a fault or short circuit, thus ensuring the safe operation of equipment and the system. Current arc suppression is typically achieved through protective devices such as circuit breakers and disconnect switches, or control strategies like grounding switches and compensation devices.

The dead zone refers to a predetermined range of current during the arc suppression process, established to avoid frequent switching operations and misoperation of protection devices. Variations in current within this range are considered ineffective and will not trigger the activation of protection devices. The configuration of the dead zone helps prevent excessive switching operations while ensuring a rapid response and protection against fault currents.

Step S420: Determine the first neutral point voltage before initial compensation based on historical ground parameters.

In this embodiment, the first neutral point voltage refers to the voltage at the neutral point prior to initial compensation, while the second neutral point voltage refers to the voltage at the neutral point after initial compensation. Since the collected ground parameters and collection times are stored in a correlated manner, it is possible to generate corresponding historical ground parameters.

Step S430: Determine the corrective current based on the first neutral point voltage, the second neutral point voltage, and the compensation current.

Step S440: Execute current arc suppression at the neutral point based on the corrective current.

As an optional implementation, perform initial compensation for the distribution network based on the compensation current calculated in the previous step to achieve arc suppression. Obtain boundary setting values and zero-sequence voltage through historical data and real-time monitoring, thereby acquiring the boundary setting values for the distribution network and the zero-sequence voltage of the bus. Let the boundary setting value be U0_max and the zero-sequence voltage be U0. Determine the second neutral point voltage after initial compensation based on the target source electromotive force, three-phase ground leakage resistance, and three-phase ground capacitance, calculating the second neutral point voltage after initial compensation as Un2. Let the second neutral point voltage be denoted as Un2. Determine the first neutral point voltage before initial compensation using historical data to ascertain the first neutral point voltage as Un1. Calculate the corrective current based on the first neutral point voltage, the second neutral point voltage, and the compensation current, represented as Ic1. The corrective current Ic1 is defined as: Ic1=(Un2−Un1)/(1/jωCn)−Ic. where Cn is the neutral point capacitance and ω is the angular frequency. Arc suppression is performed at the neutral point based on the corrective current.

Exemplarily, considering the effects of unbalanced voltage, the current to be injected is: $\dot{I}_0 = \dot{E}_A(Y_A + \alpha Y_B + \alpha^2 Y_C)$;

Therefore, the current that needs to be injected after a single-phase grounding fault occurs is: $\dot{I}_i = \dot{I}_{in} + \dot{I}_0$;

Upon detection of a single-phase grounding fault, the current neutral point voltage at that moment, namely the first neutral point voltage, is:

$$\dot{U}_{N1} = \frac{-\dot{E}_A(Y_A + \alpha Y_B + \alpha^2 Y_C) - \dot{E}_A/R_f - \dot{U}_{oh}\left(Y_A + Y_B + Y_C + \frac{1}{j\omega_n L}\right)}{Y_A + Y_B + Y_C + 1/R_f + Y_0};$$

After injecting a small current $\dot{I}_{in}$, the voltage at the second neutral point is:

$$\dot{U}_{N2} = \frac{-\dot{E}_A(Y_A + \alpha Y_B + \alpha^2 Y_C) - \dot{E}_A/R_f - \dot{U}_{oh}\left(Y_A + Y_B + Y_C + \frac{1}{j\omega_n L}\right) + \dot{I}_{in}}{Y_A + Y_B + Y_C + 1/R_f + Y_0};$$

By combining $\dot{U}_{N1}$ and $\dot{U}_{N2}$, the corrected injected current can be expressed as:

$$\dot{I}_i = \dot{I}_{in} + \dot{I}_0 = \frac{-\dot{I}_{in}(\dot{E}_A + \dot{U}_{N1})}{\dot{U}_{N2} - \dot{U}_{N1}}.$$

Where Ii is the corrected current, a current-type arc suppression method is implemented based on the corrected current.

Optionally, step S140 further includes: Step S450: When the zero-sequence voltage does not exceed the boundary setting value, the injected current is determined based on the target source electromotive force and the three-phase ground leakage resistance and three-phase ground capacitance of the distribution network.

Step S460: Voltage arc suppression is performed at the neutral point based on the injected current.

As an optional implementation, the determination of whether the zero-sequence voltage exceeds the boundary setting value is conducted by monitoring the zero-sequence voltage at the busbar of the distribution network to check if it exceeds the boundary setting value U0_max. If the zero-sequence voltage is less than or equal to the boundary setting value, it falls within the current arc suppression dead zone, necessitating voltage arc suppression. The injected current is determined by calculating based on the target source electromotive force, the three-phase ground leakage resistance, and the three-phase ground capacitance. The purpose of the injected current is to suppress the arc by injecting an appropriate current, thereby reducing the neutral point voltage to a safe range. The calculated injected current is injected into the neutral point to achieve voltage arc suppression. The injected current can be implemented through compensation devices or grounding switches.

For example, if the busbar zero-sequence voltage falls within the current arc suppression dead zone, fault phase identification is performed, and voltage-type arc suppression is applied to the fault phase until the fault phase voltage drops to zero. The expression for the injected current is as follows:

$$\dot{I} = (\dot{E}_A + \dot{U}_N)\left(Y_A + \frac{1}{R_f}\right) + (\dot{E}_B + \dot{U}_N)Y_B + (\dot{E}_C + \dot{U}_N)Y_C + \dot{U}_N Y_0$$

Arranged:

$$\dot{I} = \dot{U}_N\left(Y_A + Y_B + Y_C + Y_0 + \frac{1}{R_f}\right) + \dot{E}_A(Y_A + \alpha Y_B + \alpha^2 Y_C) + \dot{E}_A/R_f$$

$\dot{U}_f = \dot{E}_A + \dot{U}_N$, Assuming the three-phase parameters of the distribution network are symmetrical: $\dot{E}_A + \dot{E}_B + \dot{E}_C = 0$ $\dot{I}_f = \dot{U}_f/R_f = -\dot{U}_N(Y_A + Y_B + Y_C + Y_0)$ To achieve arc suppression, the fault phase voltage must be constrained to zero, at which point $\dot{U}_N = -\dot{E}_A$ $\dot{I} = -\dot{E}_A(Y_A + Y_B + Y_C + Y_0)$ Where, $Y_A$, $Y_B$, and $Y_C$ represent the ground admittances for the three phases, $$Y_A = \frac{1}{R_A} + jwC_A, \; Y_B = \frac{1}{R_B} + jwC_B, \; Y_C = \frac{1}{R_C} + jwC_C,$$

$Y_O$ is the neutral point admittance to ground, given by $Y_0 = -jwL_P$, w denotes the angular frequency, and α represents a phase shift of 120 degrees.

To achieve arc suppression, the three-phase ground leakage resistance, three-phase ground capacitance, imaginary unit, and voltage angular frequency are used to determine the three-phase ground admittance. Then, based on the arc suppression coil, imaginary unit, and voltage angular frequency, the neutral point to ground admittance is determined. Finally, by considering the three-phase ground admittance, neutral point to ground admittance, and the target fault phase's source electromotive force, the injected current is established. The voltage arc suppression is executed at the neutral point based on the injected current.

Figure 4:
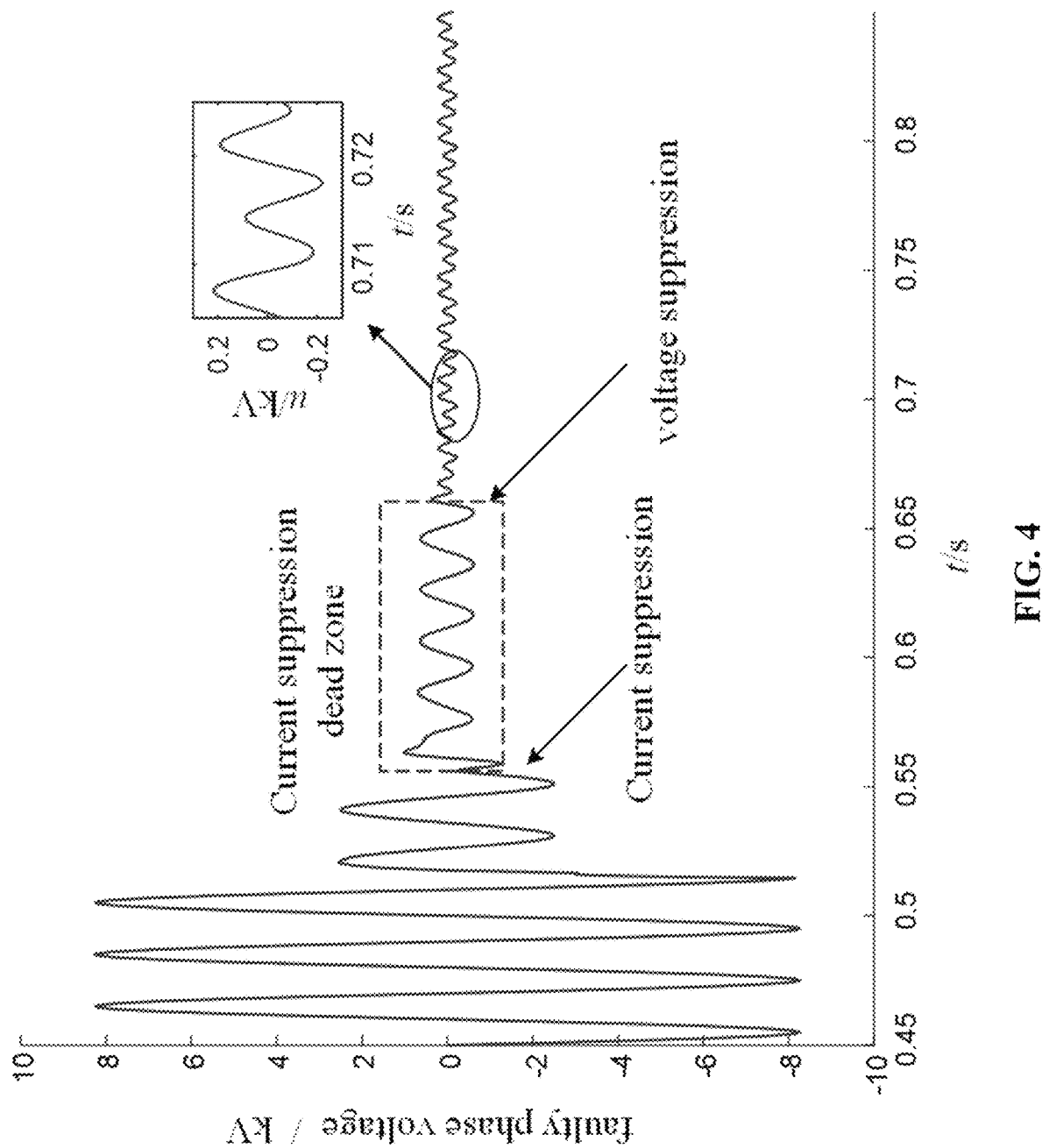
FIG. 4: Schematic of the fault phase voltage waveform in the adaptive arc suppression method for grounding faults, Implementation Example 4.

As shown in FIG. 4, which illustrates an example of the fault point voltage during the implementation of the arc suppression scheme in this embodiment, the horizontal and vertical axes in FIG. 4 are generated based on the acquisition time and the collected voltage. Current arc suppression is employed until the zero-sequence voltage of the bus enters the current arc suppression dead zone; at this point, the process shifts to voltage arc suppression until the voltage reaches zero, completing the arc suppression.

Figure 5:
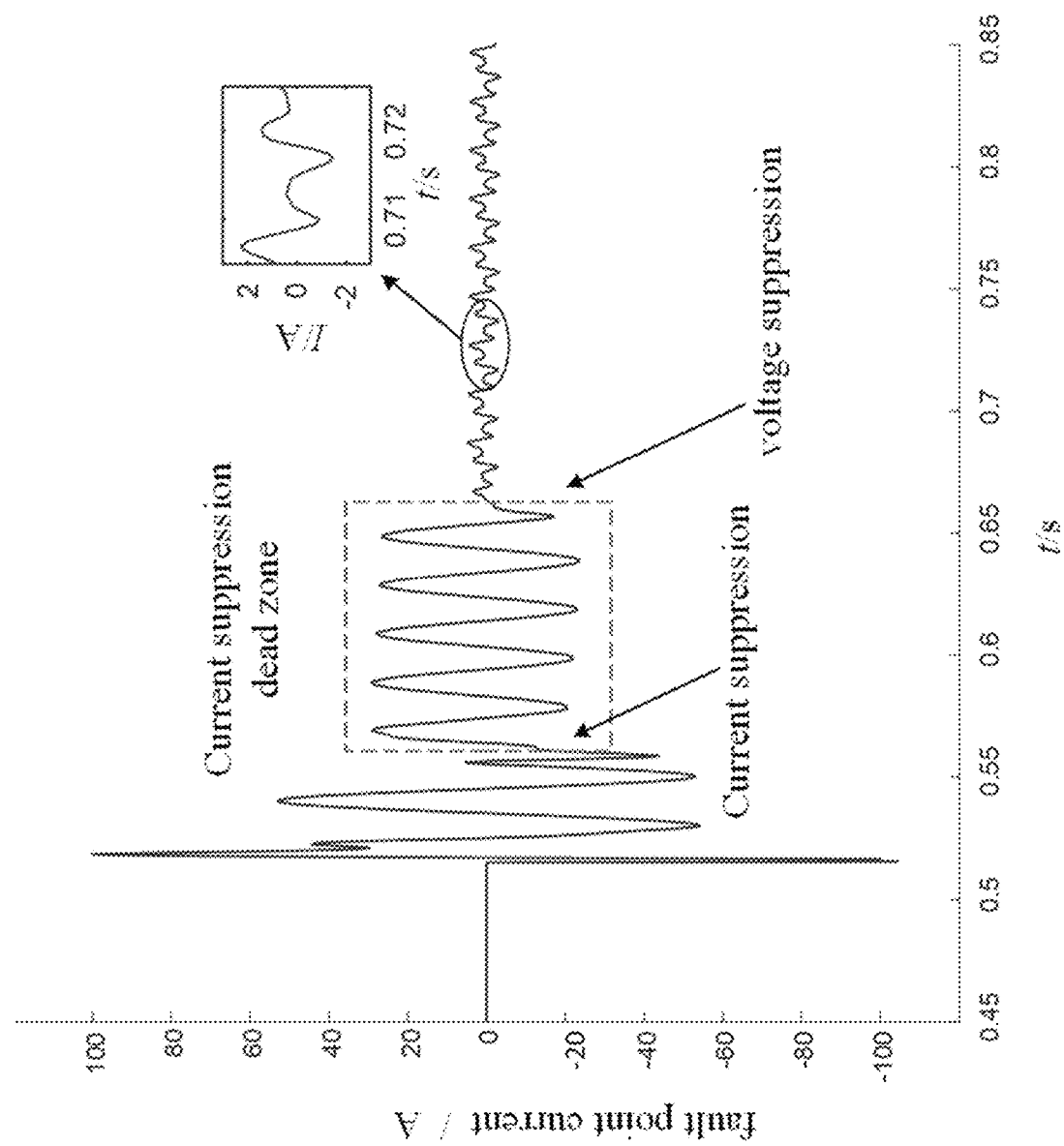
FIG. 5: Schematic of the fault phase current waveform in the adaptive arc suppression method for grounding faults, Implementation Example 4.

As depicted in FIG. 5, which illustrates an example of the fault point current during the execution of the arc suppression scheme in this embodiment, the horizontal and vertical axes in FIG. 5 are generated based on the acquisition time and the collected current. Current arc suppression is used until the zero-sequence voltage of the bus enters the current arc suppression dead zone; then, the process switches to voltage arc suppression until the current reaches zero, completing the arc suppression.

The method involves determining the corrective current based on the first neutral point voltage, the second neutral point voltage, and the compensation current when the zero-sequence voltage is greater than or equal to the boundary setting value. The corrective current is then applied to execute current arc suppression at the neutral point. When the zero-sequence voltage is not greater than the boundary setting value, the injected current is determined based on the target source electromotive force and the three-phase ground leakage resistance and capacitance of the distribution network. Voltage arc suppression is performed at the neutral point based on the injected current. This approach effectively resolves the technical issue in related technologies where either voltage arc suppression or current arc suppression can only be deployed, leading to slow response times during actual arc suppression. It enables rapid response for arc suppression schemes based on real distribution network parameters and allows for flexible configuration of current and voltage arc suppression methods.

Based on Embodiment 1, this application proposes an adaptive arc suppression method for grounding faults in a distribution network that combines active and passive techniques. The method involves measuring the ground parameters of each feeder, acquiring real-time three-phase voltage and zero-sequence voltage signals from the bus in the distribution network, and determining whether a grounding fault has occurred. Upon detection of a single-phase grounding fault, the current-type arc suppression method is initially activated, and the zero-sequence voltage at the bus is monitored. This monitored zero-sequence voltage is then compared to the preset zero-sequence voltage value to select the appropriate arc suppression method. This approach enables reliable arc suppression for single-phase grounding faults in overhead lines, cable lines, and mixed overhead-cable lines, with high sensitivity and reliability in detection results.

Figure 6:
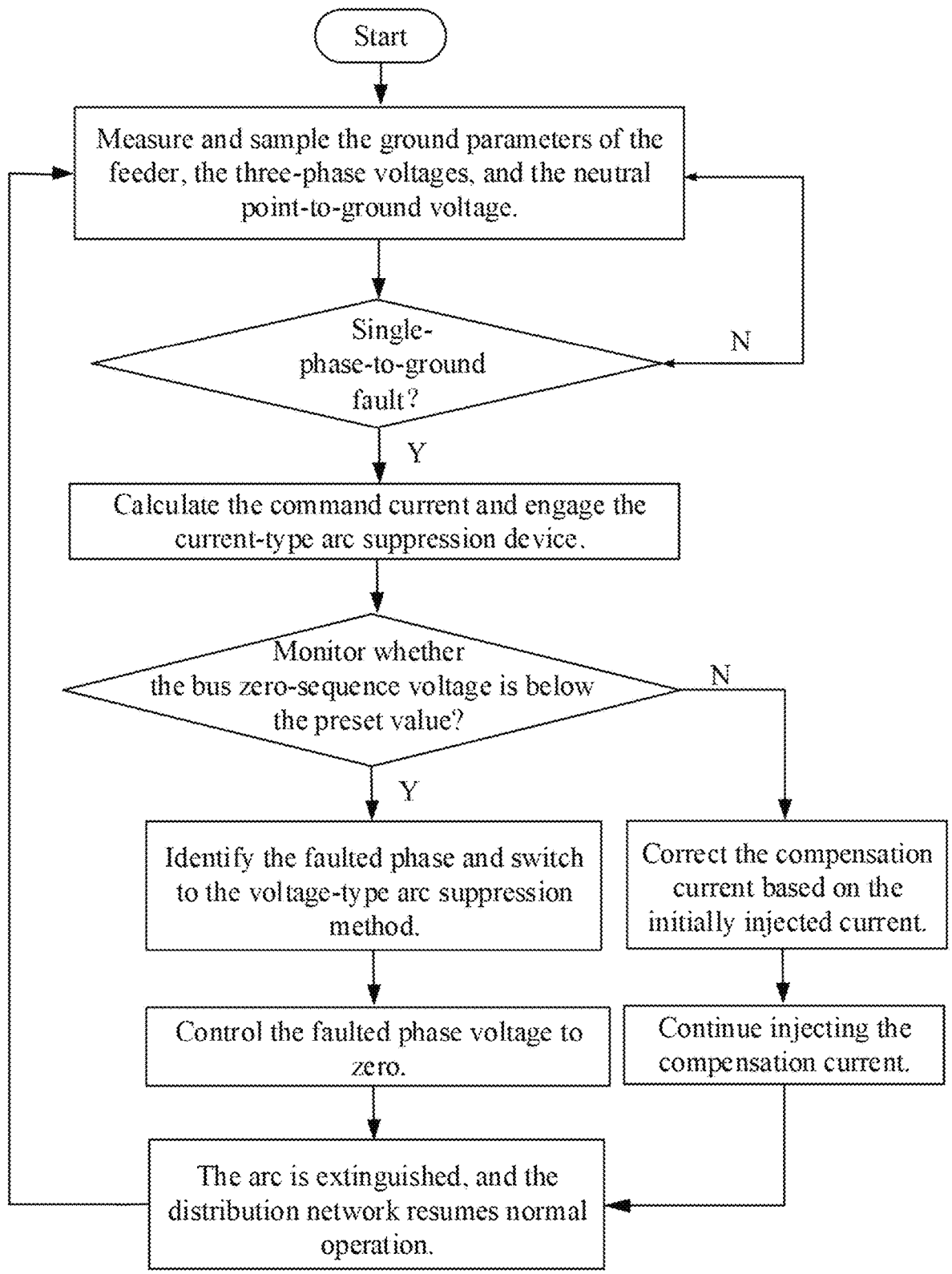
FIG. 6: Flowchart for the suppression process in the distribution network in the adaptive arc suppression method, Implementation Example 5.

Specifically, as illustrated in FIG. 6, during normal operation of the distribution network, the ground parameters of each feeder are measured, and real-time three-phase voltage and zero-sequence voltage signals from the bus are obtained. A determination is made regarding the occurrence of a grounding fault. When a grounding fault is detected, the arc suppression device is adjusted to monitor the neutral current in real time and adjust compensation. Upon detection of a single-phase grounding fault, the current-type arc suppression method is activated, and the bus's zero-sequence voltage is monitored. If the zero-sequence voltage is less than the preset value, fault phase identification is performed, and voltage arc suppression is applied to the fault phase until its voltage drops to zero. If the bus's zero-sequence voltage is not less than the preset value, the neutral point continues to apply current arc suppression until the arc is extinguished, allowing the distribution network to resume normal operation.

Figure 7:
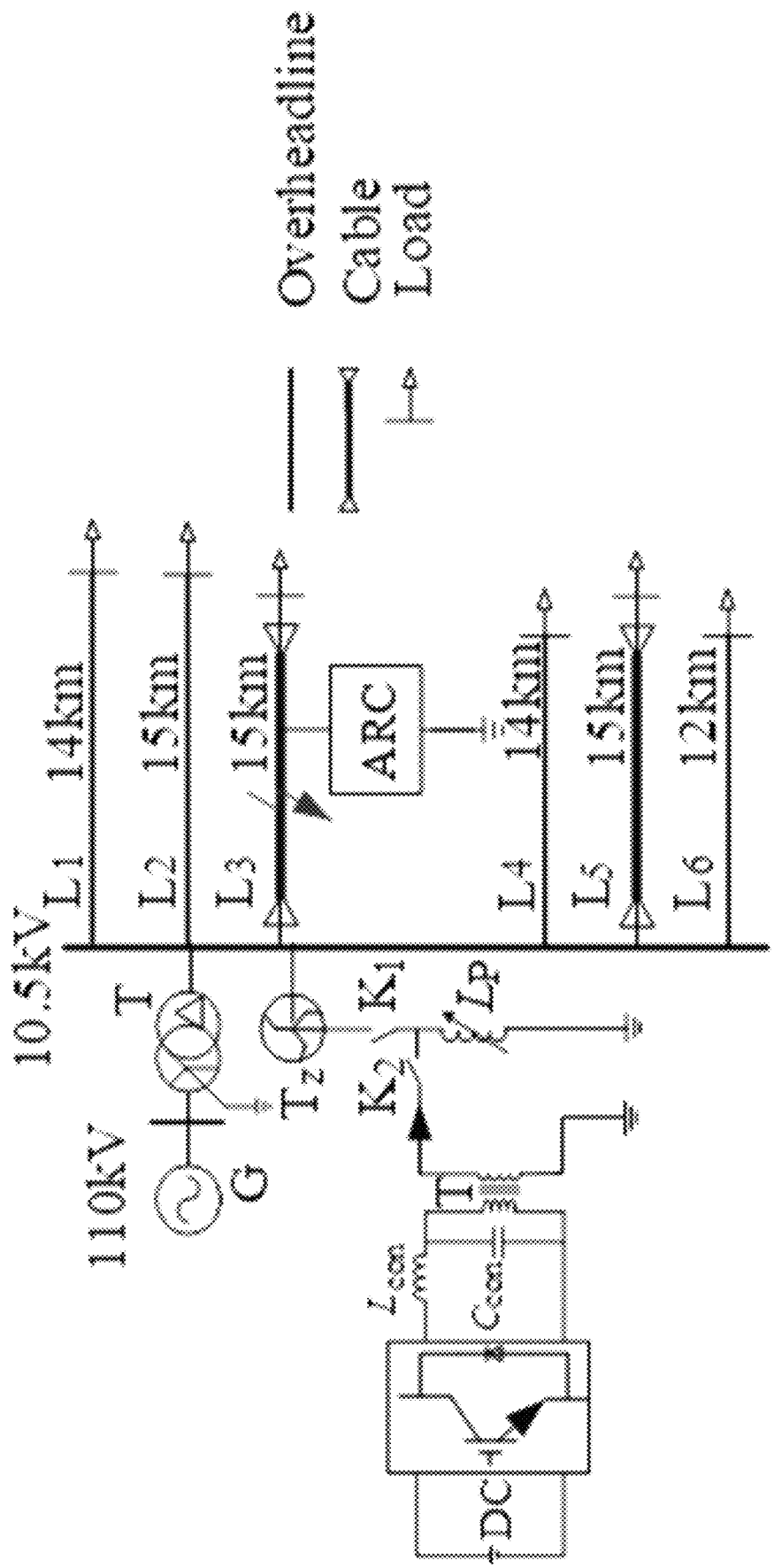
FIG. 7: Schematic of the 10 kV distribution network simulation topology in the adaptive arc suppression method, Implementation Example 5.

In this embodiment, a distribution network arc simulation model is constructed based on the actual operation of the distribution network. First, a simulation model of the distribution network is established using PSCAD or EMTDC, as shown in FIG. 7. The 110 kV/10 kV substation has a total of six outgoing lines: four overhead lines—L1=14 km, L2=15 km, L4=14 km, L6=12 km—and two pure cable lines—L3=15 km and L5=15 km. The positive sequence impedance of the overhead lines is: R1=0.45 Ω/km, L1=1.172 mH/km, C1=6.1 nF/km; the zero-sequence impedance is: R0=0.7 Ω/km, L0=3.91 mH/km, C0=3.8 nF/km. For the cable feeders, the positive sequence impedance is: R1=0.075 Ω/km, L1=0.254 mH/km, C1=318 nF/km; the zero-sequence impedance is: R0=0.102 Ω/km, L0=0.892 mH/km, C0=212 nF/km. The neutral point of the distribution system is grounded through an arc suppression coil, and a single-phase grounding fault is set in the simulation model. The fault point is located 8 meters from the first section bus of feeder L3, with an initial fault angle of 90° and a transition resistance of 200 Ω. Based on this distribution network arc simulation model, the adaptive arc-suppression method for grounding faults in the combined active and passive distribution network is executed, and the model is iteratively updated according to the simulation results.

Figure 8:
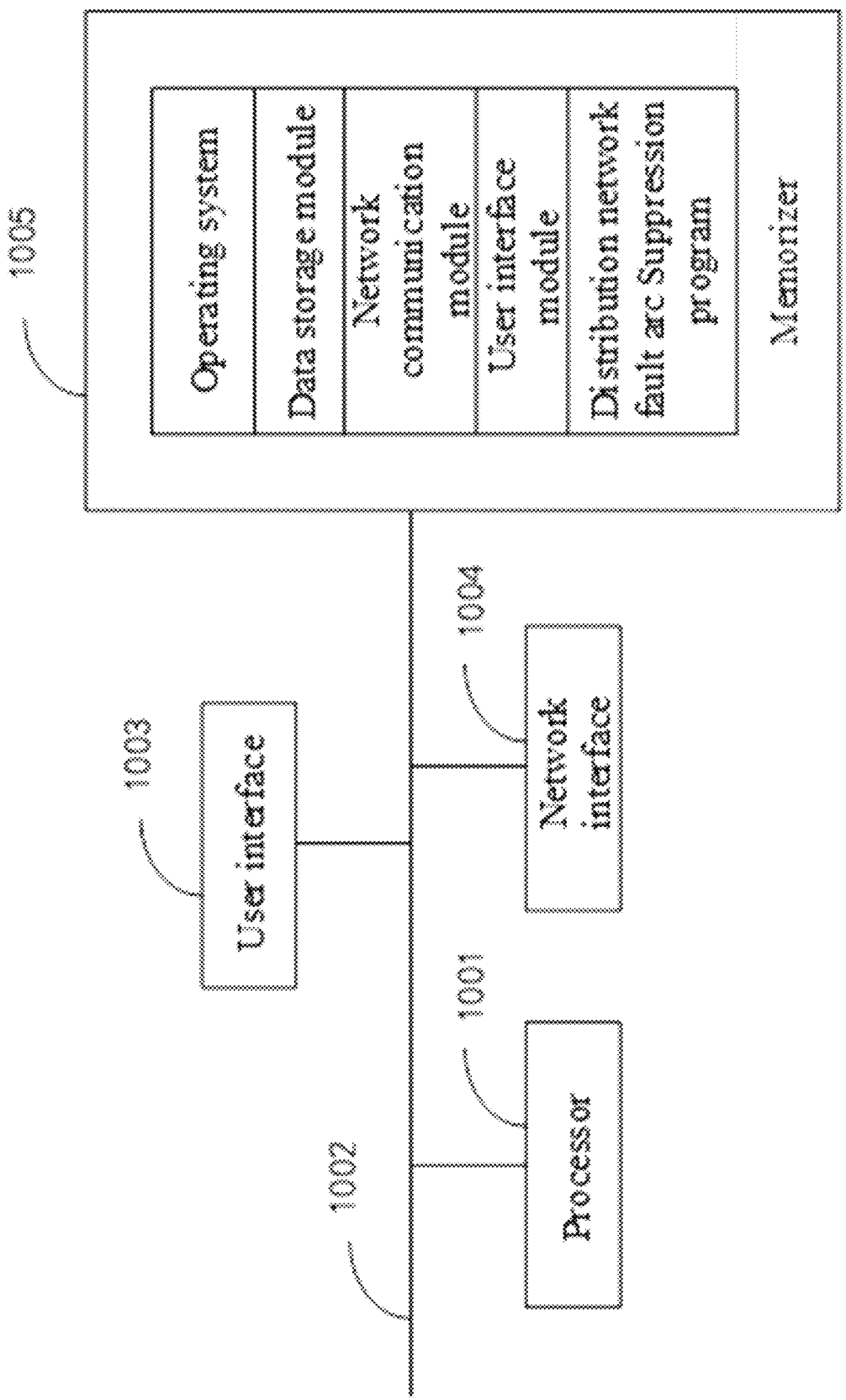
FIG. 8: Schematic of the hardware structure related to the adaptive arc suppression equipment in the combined active and passive distribution network.

The present application also proposes an adaptive arc suppression device for grounding faults in a distribution network, combining both active and passive components. Referring to FIG. 8, which illustrates the structural diagram of the hardware operating environment of the adaptive arc suppression device for grounding faults in the distribution network according to the embodiment of this application.

As shown in FIG. 8, this adaptive arc suppression device for grounding faults in a distribution network can include: a processor 1001, such as a Central Processing Unit (CPU), a communication bus 1002, a user interface 1003, a network interface 1004, and a memory 1005. The communication bus 1002 facilitates communication and connectivity among these components. The user interface 1003 may include a display, an input unit such as a keyboard, and optionally, standard wired interfaces and wireless interfaces. The network interface 1004 may optionally include standard wired interfaces and wireless interfaces (e.g., Wireless Fidelity (Wi-Fi) interfaces). The memory 1005 can be a high-speed Random Access Memory (RAM) or stable Non-Volatile Memory (NVM), such as disk storage. Additionally, memory 1005 may also comprise a storage device independent of the aforementioned processor 1001.

Those skilled in the art will appreciate that the structure illustrated in FIG. 8 does not constitute a limitation of the adaptive arc suppression device for grounding faults in a combined active and passive distribution network. It may include more or fewer components than depicted, or combinations of certain components, or arrangements of different components.

Optionally, memory 1005 is electrically connected to processor 1001, which may be used to control the operation of memory 1005 and to read data from memory 1005 for the adaptive arc suppression of grounding faults in the combined active and passive distribution network.

As shown in FIG. 8, memory 1005, as a storage medium, may include an operating system, a data storage module, a network communication module, a user interface module, and an adaptive arc suppression program for grounding faults in the combined active and passive distribution network.

Additionally, in the adaptive arc suppression device for grounding faults in the combined active and passive distribution network as illustrated in FIG. 8, network interface 1004 is primarily used for data communication with other devices, while user interface 1003 is primarily used for data interaction with the user. The processor 1001 and memory 1005 in the adaptive arc suppression device for grounding faults in the combined active and passive distribution network can be integrated within the device itself.

As illustrated in FIG. 8, the adaptive arc suppression device for grounding faults in a combined active-passive distribution network utilizes a processor (1001) to invoke the adaptive arc suppression program for grounding faults stored in memory (1005). It executes the relevant operational steps of the adaptive arc suppression method for grounding faults in the combined active-passive distribution network provided by this application:

Determine the target fault phase based on ground parameters collected from the distribution network.

Calculate the compensating current using the target source electromotive force, target ground leakage resistance, and target ground capacitance associated with the identified target fault phase.

Inject current into the neutral point of the distribution network based on the compensating current.

Determine and implement an arc suppression scheme based on the zero-sequence voltage of the busbars in the distribution network, where the arc suppression scheme includes both voltage and current suppression methods.

Optionally, the processor 1001 can invoke the adaptive arc suppression program for grounding faults in the active-passive integrated distribution network stored in memory 1005, and further perform the following operations: obtain the ground parameters for each feeder in the distribution network;

Determine the rated phase voltage magnitude and the zero-mode voltage based on the ground parameters;

Identify the target fault phase based on the zero-mode voltage and the rated phase voltage magnitude.

Optionally, the processor 1001 can invoke the adaptive arc suppression program for grounding faults in the active-passive integrated distribution network stored in memory 1005, and further perform the following operations: when the zero-mode voltage is greater than or equal to fifteen percent of the rated phase voltage magnitude, determine the target fault phase based on the transient characteristics derived from the ground parameters;

Otherwise, execute the step of obtaining the ground parameters for each feeder in the distribution network.

Optionally, the processor 1001 may invoke the active-passive combined adaptive arc-suppression program for grounding faults in the distribution network stored in memory 1005. It also performs the following operations: when the ground parameters of the three phases in the distribution network are asymmetric, it determines the three-phase source electromotive force, neutral point voltage, three-phase ground leakage resistance, three-phase ground capacitance, and the grounding fault transition resistance of the target fault phase based on the ground parameters.

Using the three-phase source electromotive force, neutral point voltage, three-phase ground leakage resistance, three-phase ground capacitance, and the grounding fault transition resistance, it calculates the compensation current.

Additionally, the processor 1001 may invoke the adaptive arc-suppression program for grounding faults in the active-passive combined distribution network stored in memory 1005 to perform the following operations: it determines the residual at the fault point of the target fault phase and the additional excitation voltage based on the ground parameters.

Subsequently, it establishes the boundary setting value based on the fault point residual, the additional excitation voltage, and the target source electromotive force.

Optionally, the processor 1001 can invoke the adaptive arc suppression program for grounding faults in a combined active and passive distribution network stored in memory 1005, and perform the following operations: When the zero-sequence voltage is greater than or equal to the boundary setting value, determine the second neutral point voltage after initial compensation based on the target source electromotive force and the three-phase ground leakage resistance and three-phase ground capacitance of the distribution network;

Determine the first neutral point voltage before initial compensation based on historical ground parameters;

Determine the correction current based on the first neutral point voltage, the second neutral point voltage, and the compensation current;

Execute current arc suppression at the neutral point based on the correction current.

Optionally, the processor 1001 can invoke the adaptive arc suppression program for grounding faults in a combined active and passive distribution network stored in memory 1005, and perform the following operations: When the zero-sequence voltage is not greater than the boundary setting value, determine the injected current based on the target source electromotive force and the three-phase ground leakage resistance and three-phase ground capacitance of the distribution network;

Based on the injected current, voltage arc suppression is performed at the neutral point.

Those skilled in the art will understand that the embodiments of this application may be provided as methods, systems, or computer program products. Thus, this application may take the form of entirely hardware embodiments, entirely software embodiments, or embodiments that combine software and hardware aspects. Furthermore, this application may also take the form of a computer program product implemented on one or more computer-readable storage media, which may include but are not limited to disk storage, CD-ROMs, optical storage, etc., containing computer-useable program code.

This application is described with reference to flowcharts and/or block diagrams illustrating the methods, devices (systems), and computer program products according to the embodiments of this application. It should be understood that each process and/or block in the flowcharts and/or block diagrams can be implemented by computer program instructions. These instructions may be provided to a general-purpose computer, special-purpose computer, embedded processor, or other programmable data processing devices to produce a machine, such that the instructions executed by the processor of the computer or other programmable data processing devices generate apparatuses that implement the functions specified in one or more processes of the flowchart and/or one or more blocks of the block diagram.

These computer program instructions may also be stored in a computer-readable storage medium that causes a computer or other programmable data processing device to operate in a particular manner, such that the instructions stored in the computer-readable storage medium produce an article of manufacture that implements the functions specified in one or more processes of the flowchart and/or one or more blocks of the block diagram.

These computer program instructions may also be loaded onto a computer or other programmable data processing device, enabling the execution of a series of operational steps that result in a computer-implemented process. Thus, the instructions executed on the computer or other programmable device provide steps for implementing the functionalities specified in one or more processes in a flowchart and/or one or more blocks in a block diagram.

It should be noted that any reference numerals enclosed in parentheses in the claims should not be construed as limiting the claims. The term "comprising" does not exclude the presence of components or steps not listed in the claims. The terms "a" or "an" preceding a component do not exclude the existence of multiple such components. This application can be implemented using hardware that includes several different components as well as through appropriately programmed computers. In the enumeration of several device unit claims, some of these devices may be represented by the same hardware item. The use of terms such as first, second, and third does not imply any order; these terms can be interpreted as labels.

Although preferred embodiments of this application have been described, those skilled in the art may make various alterations and modifications to these embodiments once they understand the fundamental inventive concepts. Therefore, the appended claims are intended to be interpreted as encompassing not only the preferred embodiments but also all changes and modifications that fall within the scope of this application.

It is evident that those skilled in the art can make various changes and variations to this application without departing from its spirit and scope. Thus, if such modifications and variations of this application fall within the scope of the claims and their equivalents, this application is also intended to encompass these changes and variations.

What is claimed is:

1. An Adaptive Arc Suppression Method for Ground Faults in a combined Active-Passive Distribution Network, characterized in that the method includes:
   determining the target fault phase based on ground parameters collected from the distribution network;
   calculating a compensation current based on a target electromotive force of the power source, the target ground leakage resistance, and the target ground capacitance of the identified fault phase;
   injecting current into the neutral point of the distribution network based on the compensation current;
   determining and executing an arc suppression scheme based on a zero-sequence voltage of busbars in the distribution network, which includes both voltage-based and current-based arc suppression methods, wherein:
   steps for determining the compensation current based on the target electromotive force of a faulted phase, target ground leakage resistance, and target ground capacitance include:
      when the ground parameters of three phases in the distribution network are symmetrical, determining a first product of the target electromotive force and the target ground leakage resistance;
      determining a second product of the target electromotive force and the target ground capacitance;
      determining the compensation current based on the first product and the second product;
      wherein the compensation current equation is as follows:

$$\dot{I}_{in} = (\dot{U}_N + \dot{E}_A)\left(\frac{1}{R_A} + j\omega C_A + \frac{1}{R_f}\right) +$$

$$(\dot{U}_N + \dot{E}_B)\left(\frac{1}{R_B} + j\omega C_B\right) + (\dot{U}_N + \dot{E}_C)\left(\frac{1}{R_C} + j\omega C_C\right) +$$

$$\dot{U}_N \frac{1}{j\omega L} + \dot{U}_{oh}\left(j\omega(C_A + C_B + C_C) + \frac{1}{R_A} + \frac{1}{R_B} + \frac{1}{R_C} + \frac{1}{j\omega_n L}\right)$$

Simplified as:

$$\dot{I}_{in} = -\dot{E}_A\left(\frac{3}{R_0} + 3j\omega C_0 + \frac{1}{j\omega L}\right) + \sum_{n=3,4}^{\infty} \dot{U}_{oh}\left(3j\omega C_0 + \frac{3}{R_0} + \frac{1}{j\omega_n L}\right);$$

where, $\omega$ represents an angular frequency, $\omega_n$ denotes the angular frequency under the n-th harmonic, j is the imaginary unit, $\dot{U}_N$ refers to a neutral point voltage, $R_0$ is a relative ground leakage resistance, $C_0$ is a relative ground capacitance, L signifies an inductance of an arc suppression coil, $U_{oh}$ indicates the neutral point voltage of the harmonic, and $\dot{E}_A$, $\dot{E}_B$, $\dot{E}_C$ are the electromotive forces of the three-phase power supply in the distribution network. $\dot{U}_N$ represents the neutral point voltage in the distribution network, while $R_A$, $R_B$, $R_C$ are the ground leakage resistances for the three phases in the distribution network, additionally, $C_A$, $C_B$, $C_C$ are the ground capacitances for the three phases in the distribution network, and $R_f$ denotes the transitional resistance for grounding faults;

steps for determining and executing the arc suppression scheme based on the zero-sequence voltage of the busbars in the distribution network include:
   when the zero-sequence voltage is greater than or equal to a boundary setting value, wherein:
      a second neutral point voltage after initial compensation is determined based on the target source electromotive force and the three-phase ground leakage resistances and capacitances of the distribution network;
      a first neutral point voltage prior to initial compensation is determined based on historical ground parameters;
      a corrective current is determined based on the first neutral point voltage, the second neutral point voltage, and the compensation current;
      current suppression at the neutral point is executed based on the corrective current;
      taking into account the effect of unbalanced voltage, an injected current is defined as: $\dot{I}_0 = \dot{E}_A(Y_A + \alpha Y_B + \alpha^2 Y_C)$;
      therefore, the current that needs to be injected after a single-phase grounding fault occurs is: $\dot{I}_t = \dot{I}_{in} + \dot{I}_0$; and upon detection of a single-phase grounding fault, the current neutral point voltage at that moment, namely the first neutral point voltage, is:

$$\dot{U}_{N1} = \frac{-\dot{E}_A(Y_A + \alpha Y_B + \alpha^2 Y_C) - \dot{E}_A/R_f - \dot{U}_{oh}\left(Y_A + Y_B + Y_C + \frac{1}{j\omega_n L}\right)}{Y_A + Y_B + Y_C + 1/R_f + Y_0};$$

after injecting a small current $\dot{I}_{in}$, the voltage at the second neutral point is:

$$\dot{U}_{N2} = \frac{-\dot{E}_A(Y_A + \alpha Y_B + \alpha^2 Y_C) - \dot{E}_A/R_f - \dot{U}_{oh}\left(Y_A + Y_B + Y_C + \frac{1}{j\omega_n L}\right) + \dot{I}_{in}}{Y_A + Y_B + Y_C + 1/R_f + Y_0};$$

by combining $\dot{U}_{N1}$ and $\dot{U}_{N2}$, the corrected injected current is expressed as:

$$\dot{I}_i = \dot{I}_{in} + \dot{I}_0 = \frac{-\dot{I}_{in}(\dot{E}_A + \dot{U}_{N1})}{\dot{U}_{N2} - \dot{U}_{N1}}。$$

where, $Y_A$, $Y_B$, and $Y_C$ represent the ground admittances for the three phases, $$Y_A = \frac{1}{R_A} + jwC_A,\ Y_B = \frac{1}{R_B} + jwC_B,\ Y_C = \frac{1}{R_C} + jwC_C,$$

$Y_O$ is the neutral point admittance to ground, given by $Y_0 = -jwL_P$, w denotes the angular frequency, and $\alpha$ represents a phase shift of 120 degrees; and the steps for determining and executing the arc suppression scheme based on the zero-sequence voltage of the bus in the distribution network include:
when the zero-sequence voltage is not greater than the boundary setting value, the injection current is determined based on the electromotive force of the target power supply and the three-relative ground leakage resistance and three-relative ground capacitance of the distribution network; and
performing voltage arc suppression at the neutral point based on the injected current.

2. The adaptive arc suppression method for ground faults in the combined active-passive distribution network as claimed in claim 1, characterized in that the step of determining the target fault phase based on the ground parameters collected from the distribution network includes:
acquiring the ground parameters for each feeder in the distribution network;
determining the rated phase voltage amplitude and the zero-sequence voltage of the feeder based on the ground parameters; and
determining the target fault phase based on the zero-sequence voltage and the rated phase voltage amplitude.

3. The adaptive arc suppression method for ground faults in the combined active-passive distribution network as claimed in claim 1, characterized in that the step of determining the target fault phase based on the zero-sequence voltage and the rated phase voltage amplitude includes:
when the zero-sequence voltage is greater than or equal to fifteen percent of the rated phase voltage amplitude, determining the target fault phase based on the transient characteristics derived from the ground parameters,
otherwise, executing the step of acquiring the ground parameters for each feeder in the distribution network.

4. The adaptive arc suppression method for grounding faults in the combined active and passive distribution network as claimed in claim 1, characterized in that it includes the following steps prior to injecting current into the neutral point of the distribution network based on the compensation current:
when the ground parameters of the three phases in the distribution network are asymmetric, determine the three-phase source electromotive force, neutral point voltage, three-phase ground leakage resistance, three-phase ground capacitance, and the grounding fault transition resistance of the target fault phase based on the ground parameters, and
determine the compensation current based on the three-phase source electromotive force, neutral point voltage, three-phase ground leakage resistance, three-phase ground capacitance, and the grounding fault transition resistance.

5. The adaptive arc suppression method for grounding faults in the combined active and passive distribution network as claimed in claim 1, characterized in that it includes the following steps prior to determining and executing the arc suppression scheme based on the zero-sequence voltage of the bus in the distribution network:
determine the residual fault at the fault point of the target fault phase and the additional excitation voltage based on the ground parameters; and
determine the boundary setting value based on the residual fault at the fault point, the additional excitation voltage, and the target source electromotive force.

6. An adaptive arc suppression device for grounding faults in the combined active and passive distribution network, characterized in that it includes a memory, a processor, and an adaptive arc suppression program for grounding faults in the combined active and passive distribution network stored in the memory and executable on the processor wherein, the processor implements the steps of the adaptive arc suppression method for grounding faults in a combined active and passive distribution network as claimed in claim 1 when executing the adaptive arc suppression program.

7. A computer-readable storage medium, characterized in that it stores an adaptive arc suppression program for grounding faults in the combined active and passive distribution network, wherein the steps of the adaptive arc suppression method for grounding faults in the combined active and passive distribution network as claimed in claim 1 are implemented when the program is executed by a processor.

* * * * *